United States Patent
Rogers et al.

(10) Patent No.: US 11,038,283 B2
(45) Date of Patent: Jun. 15, 2021

(54) RECONFIGURABLE APERTURE-COUPLED PATCH ANTENNA

(71) Applicant: The Boeing Company, Chicago, IL (US)

(72) Inventors: John E. Rogers, Owens Cross Roads, AL (US); John D. Williams, Decatur, AL (US)

(73) Assignee: THE BOEING COMPANY, Chicago, IL (US)

( * ) Notice: Subject to any disclaimer, the term of this patent is extended or adjusted under 35 U.S.C. 154(b) by 127 days.

(21) Appl. No.: 16/137,278

(22) Filed: Sep. 20, 2018

(65) Prior Publication Data

US 2020/0099141 A1    Mar. 26, 2020

(51) Int. Cl.
| | |
|---|---|
| *H01Q 1/38* | (2006.01) |
| *H01Q 9/04* | (2006.01) |
| *H01Q 21/06* | (2006.01) |
| *H01L 23/66* | (2006.01) |
| *H01Q 1/22* | (2006.01) |
| *G06K 19/077* | (2006.01) |

(52) U.S. Cl.
CPC ..... *H01Q 21/065* (2013.01); *G06K 19/07749* (2013.01); *H01L 23/66* (2013.01); *H01Q 1/2283* (2013.01); *H01Q 1/38* (2013.01); *H01Q 9/0457* (2013.01)

(58) Field of Classification Search
CPC .... G06K 19/07749; H01L 23/66; H01Q 1/22; H01Q 1/2283; H01Q 1/38; H01Q 21/06; H01Q 21/065; H01Q 9/04; H01Q 9/0457; H01Q 21/00; H01Q 21/0075; H01Q 5/38; H01Q 5/385; H01Q 9/0428; H01Q 9/0442

See application file for complete search history.

(56) References Cited

U.S. PATENT DOCUMENTS

| | | | | |
|---|---|---|---|---|
| 2,834,959 A | * | 5/1958 | Dorne | H01Q 13/18 343/769 |
| 4,821,040 A | * | 4/1989 | Johnson | H01Q 1/3275 343/700 MS |

(Continued)

OTHER PUBLICATIONS

Yang, F., et al., "A Reconfigurable Patch Antenna Using Switchable Slots for Circular Polarization Diversity", IEEE Microwave and Wireless Components Letters, Mar. 2002, pp. 96-98, vol. 12, No. 3.

(Continued)

*Primary Examiner* — Tho G Phan
(74) *Attorney, Agent, or Firm* — Gates & Cooper LLP (57) ABSTRACT

An electronically configurable antenna is disclosed. In one embodiment, the antenna comprises a circuit board having a composite dielectric that has a top surface and a bottom surface. An inner antenna element and a coupling element are disposed on the top surface, with the coupling element disposed about a periphery of and substantially coplanar with the antenna element. The coupling element is selectably electrically shorted to the inner antenna element to configure the antenna. The electronically configurable antenna further has a conductor extending through the composite dielectric between the top surface and the bottom surface and a lower electrical ground plane on the bottom surface to minimize any change in the antenna's electrical behavior due to the conductivity of the surfaces to which they are mounted.

20 Claims, 11 Drawing Sheets

(56) References Cited

U.S. PATENT DOCUMENTS

| | | | | | |
|---|---|---|---|---|---|
| 5,497,164 | A | * | 3/1996 | Croq | H01Q 9/0414 343/700 MS |
| 5,565,875 | A | * | 10/1996 | Buralli | H01Q 9/0464 343/700 MS |
| 5,568,157 | A | * | 10/1996 | Anderson | H01Q 1/3275 343/713 |

OTHER PUBLICATIONS

Kim, B., et al., "A Novel Single-Feed Circular Microstrip Antenna With Reconfigurable Polarization Capability", IEEE Transactions on Antennas and Propagation, Mar. 2008, pp. 630-638, vol. 56, No. 3.

Chen, R-H., et al., "Single-Fed Microstrip Patch Antenna With Switchable Polarization", IEEE Transactions on Antennas and Propagation, Apr. 2008, pp. 922-926, vol. 56, No. 4.

Ge, L., et al., "Frequency-Reconfigurable Low-Profile Circular Monopolar Patch Antenna", IEEE Transactions on Antennas and Propagation, Jul. 2014, pp. 3443-3449.

Pozar, D.M., "Microstrip Antenna Aperturecoupled to a Microstripline", Electronics Letters, Jan. 1985, pp. 49-50, vol. 21, No. 2.

Pozar, D.M., et al., "Increasing the Bandwidth of a Microstrip Antenna by Proximity Coupling", Electronics Letters, Apr. 1987, pp. 368-369, vol. 23, No. 8.

* cited by examiner

RECONFIGURABLE APERTURE-COUPLED PATCH ANTENNA

BACKGROUND

1. Field

The present disclosure relates to systems for receiving and transmitting signals, and in particular to a reconfigurable aperture-coupled patch antenna and a method for using and producing same.

2. Description of the Related Art

There is a need for sensors capable of conforming to non-planar surfaces such as aircraft wings and fuselages. Such sensors, known as conformal sensors, substantially conform to the contours of the surface that they are mounted on or of which surface they form a part. Low profile conformal sensor nodes are useful in many applications, including structural health monitoring and diagnostic testing. With regard to structural health monitoring, conformal antennas in sensor nodes can gather information about an aircraft in real time, including airframe characteristics including hoop stress, shear stress, compression, corrosion resistance, bending, torsion, crack growth, high local loads, longitudinal stress and impacts. With regard to diagnostic testing, conformal antennas in sensor nodes can be used for condition monitoring on the factory floor.

Unmanned aerial vehicles (UAVs) have conformal surfaces with low radii of curvature, and typically need light weight antennas with low radar cross sections and low air drag for improved efficiency. Also, like other aircraft, UAV surfaces are typically either metallic or a carbon fiber material, which are conductive in nature and may change the behavior of an antenna. In some applications, there is a need for wideband antennas capable of being reconfigurable for operation within different frequency bands.

Existing reconfigurable planar antennas based on co-planar microstrip feed and pin feed types are inherently bandwidth-limited due to their resonant nature. The bandwidth of planar patch antennas has been shown to be increased by using an aperture coupled feed line. Existing aperture coupled planar antennas are fed on the backside of the antenna, which results in an antenna with electrical characteristics that vary with the characteristics (e.g. conductivity) of the surface upon which they are mounted. Such antennas are known as non-surface agnostic.

What is needed is a low-profile reconfigurable antenna having a microstrip feed network with a lower electrical ground plane to minimize any change in the antenna's electrical behavior due to the conductivity of the surfaces to which they are mounted.

SUMMARY

To address the requirements described above, this document discloses a planar antenna and a method for producing same. One embodiment is evidenced by an electronically configurable antenna, comprising a circuit board that includes a composite dielectric. The composite dielectric has: a top surface and a bottom surface. The top surface has an antenna element including: an inner antenna element component disposed on the top surface; a coupling antenna element component disposed about a periphery of and substantially coplanar with the inner antenna element component, wherein the coupling antenna element component is selectably electrically shorted (upon activation) to the inner antenna element. The bottom surface comprises a conductive ground plane. A conductor extends through the composite dielectric between the top surface and the bottom surface, wherein the conductor forms a microstrip feed extending from an antenna input to a portion underneath the antenna element. In one embodiment, the coupling antenna element component is coplanar with the inner antenna element component. In another embodiment, the inner antenna element component comprises an inner antenna conductive surface having an aperture; and the inner antenna conductive surface is aperture coupled to the microstrip feed.

Another embodiment is evidenced by a method of forming a planar array antenna. The method comprises generating a first laminated portion, generating a second laminated portion, and laminating the first laminated portion and the second laminated portion.

The first laminated portion comprises an inner antenna element component having a slot and a coupling antenna element component on a top surface planar portion of a first dielectric layer, the coupling antenna element component disposed about a periphery of and substantially coplanar with the inner antenna element component, a second dielectric layer having a portion configured to accept a switch, a first conductive via through the first dielectric layer and the second dielectric layer from a bottom of the first dielectric layer and the second dielectric layer to the inner antenna element component, and a second conductive via through the first dielectric layer and second dielectric layer from the bottom of the first dielectric layer and the second dielectric layer to the coupling antenna element component. The second laminated portion comprises a microstrip, a first conductive switch feed element, and a second conductive switch feed element on a top surface of a third dielectric layer, a conductive ground plane on a bottom surface of a fourth dielectric layer, and a switch, electrically connected between the first conductive switch feed element and the inner antenna element component. Further, the switch is disposed in the portion of the second dielectric layer with the first conductive via forming a conductive path from the first conductive switch feed element and the inner antenna element component; and the second conductive via forms a second conductive path from the second conductive switch feed element and the coupling antenna element component.

In another embodiment, generating a first laminated portion comprises disposing the inner antenna element component having the slot and the coupling antenna element component on the top surface planar portion of the first dielectric layer, the coupling antenna element component disposed about the periphery of the inner antenna element component, processing the second dielectric layer to create a portion configured to accept the switch, laminating the first dielectric layer and the second dielectric layer with the second dielectric layer portion between the inner antenna element component and the coupling antenna element component, etching a first via through the laminated first dielectric layer and the second dielectric layer from the bottom of the laminated first dielectric layer and the second dielectric layer to the inner antenna element component, etching a second via through the laminated first dielectric layer and second dielectric layer from the bottom of the laminated first dielectric layer and the second dielectric layer to the coupling antenna element component, and conductively treating the first via and the second via. Further, generating a second laminated portion comprises disposing the microstrip, the first conductive switch feed element, and the second conductive switch feed element on the top surface planar portion of the third dielectric layer, disposing the conductive ground plane on a bottom surface of the fourth dielectric layer, laminating the third dielectric layer and the fourth dielectric layer, and electrically connecting the switch between the first conductive switch feed element and the inner antenna element component. A still further embodiment is evidenced by a planar array antenna, formed by the above-described process.

The features, functions, and advantages that have been discussed can be achieved independently in various embodiments of the present invention or may be combined in yet other embodiments, further details of which can be seen with reference to the following description and drawings.

BRIEF DESCRIPTION OF THE DRAWINGS

Referring now to the drawings in which like reference numbers represent corresponding parts throughout.

DESCRIPTION

In the following description, reference is made to the accompanying drawings which form a part hereof, and which is shown, by way of illustration, several embodiments. It is understood that other embodiments may be utilized and structural changes may be made without departing from the scope of the present disclosure.

Overview

A low-profile reconfigurable antenna based on aperture coupled antenna elements with inclusive slots and outer coupling elements is disclosed in this specification. The antenna provides increased bandwidth and decreased axial ratio (i.e., increased cross polarization). Cross polarization reduces signal loss from transmitter to receiver due to antenna misalignment. The reconfigurable antenna also has a microstrip feed network with a lower electrical ground plane to minimize any change in the antenna's electrical behavior due to conductive surfaces, and is therefore surface agnostic.

The antenna comprises a number of features which can be characterized by a number of embodiments. Such features may also be combined in selected embodiments as disclosed further herein. For example, in one embodiment, the reconfigurable antenna has an embedded RF microstrip network electrically coupled to a lower electrical ground plane for efficient signal propagation and simplification of planar arraying. In another embodiment, the reconfigurable antenna has a lower electrical ground plane to minimize any change in the antenna's electrical behavior due to conductive surfaces. In still another embodiment, the antenna uses aperture coupled antenna elements for simplistic feeding, planar arraying, and reduction of antenna failure due to flexure. In yet another embodiment, the antenna features outer coupling elements along the same plane as the antenna elements for reducing the operating frequency of the antenna when activated by embedded RF switches. In a further embodiment, the antenna can utilize thin RF dielectrics for conformal applications due to the use of an aperture coupled feed. Also, in another embodiment, the antenna has cross polarization with increased bandwidth due to using aperture coupled antenna elements with inclusive slots, thus resulting in reduced signal loss from transmitter to receiver due to antenna misalignment.

Figure 1A:
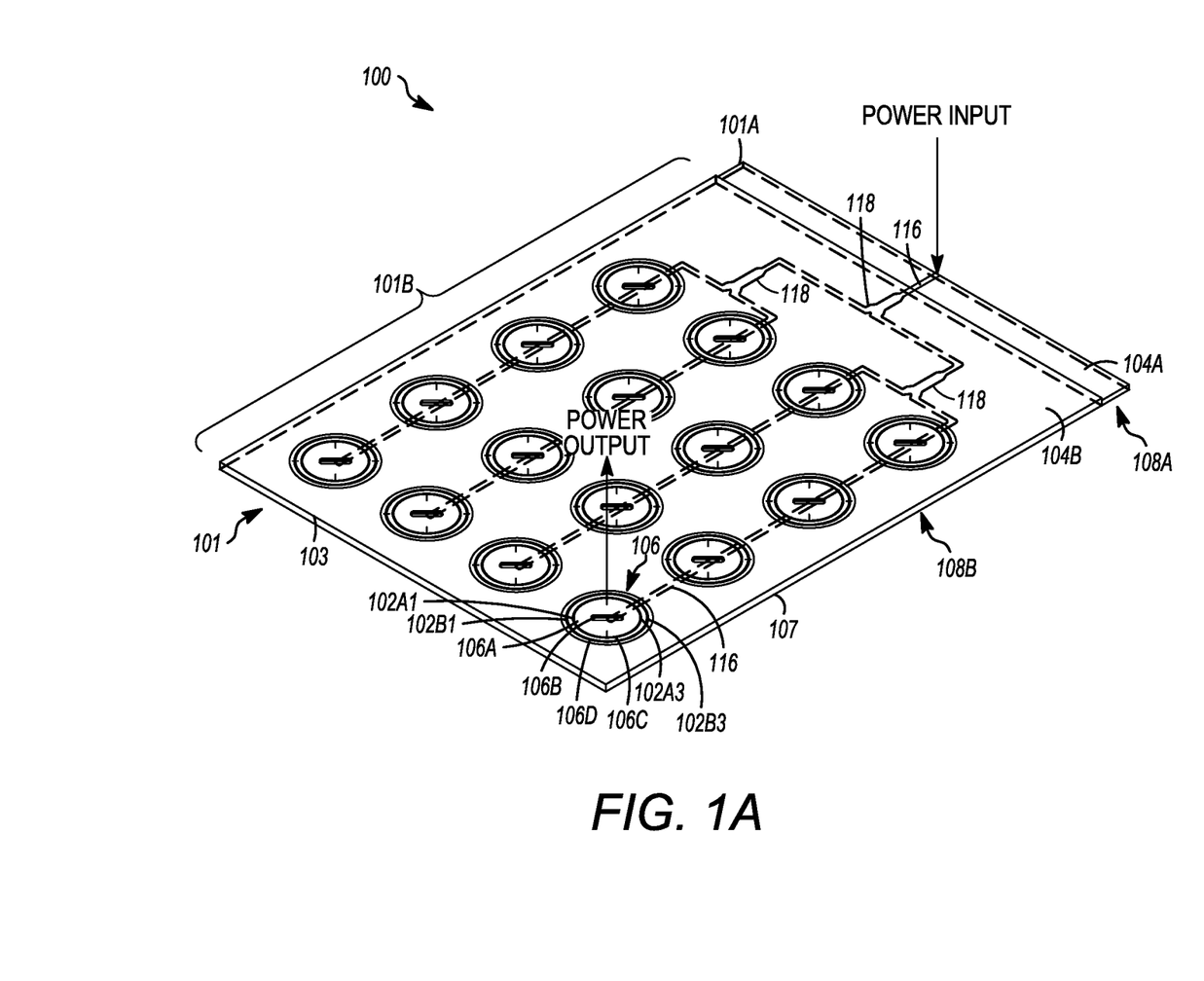
FIGS. 1A and 1B are diagrams illustrating one embodiment of the antenna.
Figure 1B:
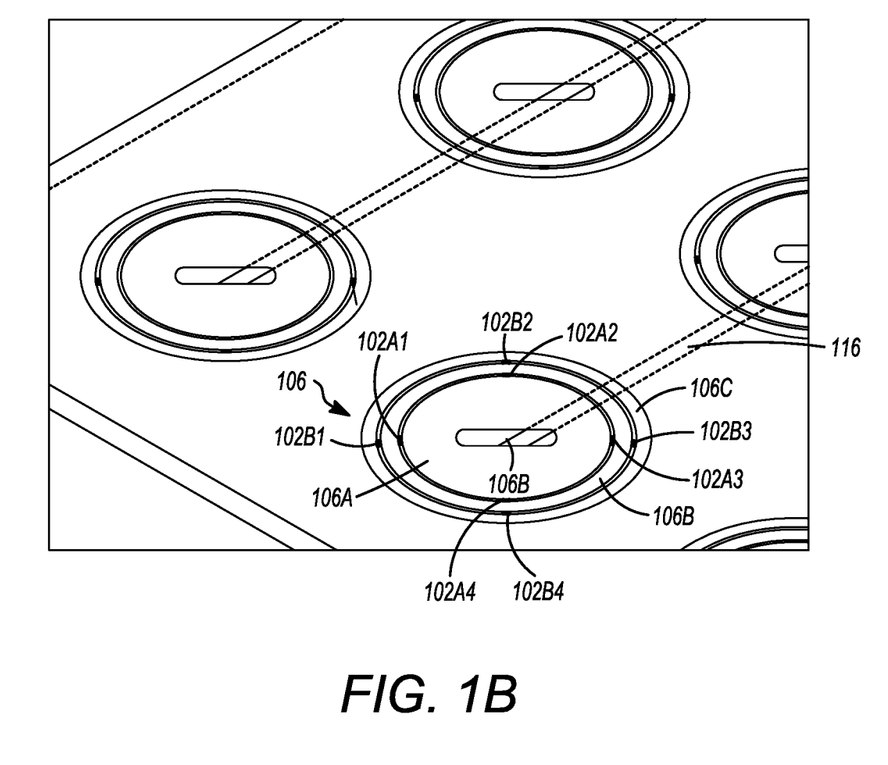

FIGS. 1A and 1B are diagrams illustrating one embodiment of the antenna 100. In the illustrated embodiment, the antenna 100 includes an RF circuit board 101 having a composite dielectric 103. The RF circuit board 101 includes a first RF circuit board portion 101A and a second RF circuit board portion 101B. The RF circuit board 101 also comprises a top planar surface 104 that has a first top surface planar portion 104A and a second top surface planar portion 104B. The second top surface planar portion 104B has at least one antenna element 106. In the illustrated embodiment, a 4×4 array of antenna elements 106 is included.

The RF circuit board 101 also comprises a bottom planar surface 108 which has a first bottom surface planar portion 108A and a second bottom surface planar portion 108B. A bottom surface ground plane 107 extends along the first bottom surface planar portion 108A and the second bottom surface planar portion 108B. A conductor 116 extending on a top surface of the circuit board first portion 101A and through the circuit board second portion 101B forms a microstrip with the bottom surface ground plane 107 of the first and second bottom surface planar portions 108A and 108B, respectively. The conductor 116 includes one or more power dividers 118.

Each antenna element 106 comprises inner antenna element component 106A having a conductive surface with a slot or aperture 106B. This aperture 106B couples the antenna element 106 to the microstrip feed formed by the conductor 116, the ground plane 107, and dielectric material therebetween.

Each antenna element 106 also comprises a coupling antenna element component 106C disposed about a periphery of and substantially coplanar with the inner antenna element component 106A. In the illustrated embodiment, the coupling antenna element component 106C is coplanar with the other elements of the antenna element 106. In the illustrated embodiment, the inner antenna element component 106A is circular and the coupling antenna element component 106C is an annulus concentric with the inner antenna element component 106A, and the coupling antenna element component 106C has an interior radius larger than an exterior radius of the inner antenna element component 106A by a distance d.

The coupling antenna element component 106C is selectably electrically shorted to the inner antenna element component 106A by one or more switches 102 (e.g. RF switches). Selectable activation of the one or more switches 102A electrically shorts the inner antenna element component 106A to the coupling antenna element component 106C, thus increasing the effective area of the antenna element 106.

The antenna element(s) 106 may also comprise additional coupling element components. For example, in the illustrated embodiment, the antenna element 106 also comprises a second coupling element component 106D disposed about a periphery of the first coupling antenna element component 106C and substantially coplanar with both the inner antenna element component 106A and the first coupling antenna element component 106C. The second coupling element component 106D is selectably electrically shorted to the first coupling antenna element component 106C by one or more switches 102B. Selectable activation of the one or more switches 102B electrically shorts the second coupling element component 106D to the first coupling antenna element component 106C (already coupled to the inner antenna element component 106A by switch(es) 102), thus further increasing the effective area of the antenna element 106.

Figure 2A:
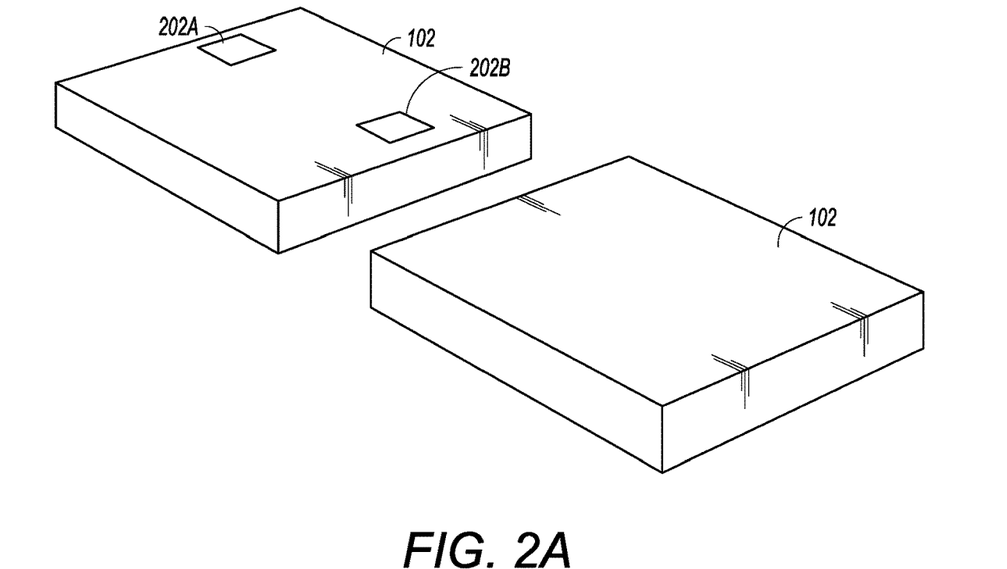
FIG. 2A is a diagram depicting one embodiment of an RF switch.

FIG. 2A is a diagram depicting one embodiment of an RF switch 102. As illustrated, the RF switch 102 comprises two conductive surfaces 202A and 202B, and activation of the RF switch 102 electrically shorts conductive surface 202A and conductive surface 202B. For example, RF switch 102A is mounted so that one conductive surface (e.g. 202A) is electrically connected to the conductive inner antenna element component 106A and the other conductive surface (e.g. 202B) is electrically connected to the coupling antenna element component 106C. Activation of the RF switch 102A, therefore electrically shorts the inner antenna element component 106A to the conductive coupling antenna element component 106C, thus increasing the effective area of the antenna element 106.

Figure 2B:
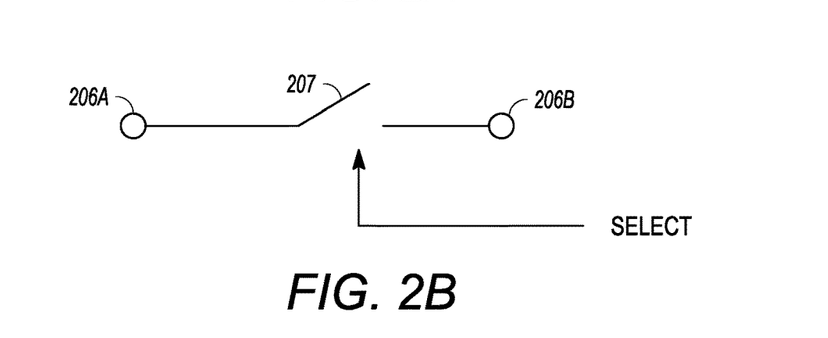
FIG. 2B is a diagram depicting a simplified schematic of an RF switch.

FIG. 2B is a diagram depicting a simplified schematic of an RF switch 102 in the RF circuit board 101. In the illustrated embodiment, the RF switch has nodes 206A and 206B, which are electrically connected to conductive surfaces 202A and 202B, respectively. Switching element 207 electrically shorts (upon activation) nodes 206A and 206B in accordance with the select input.

Figure 2C:
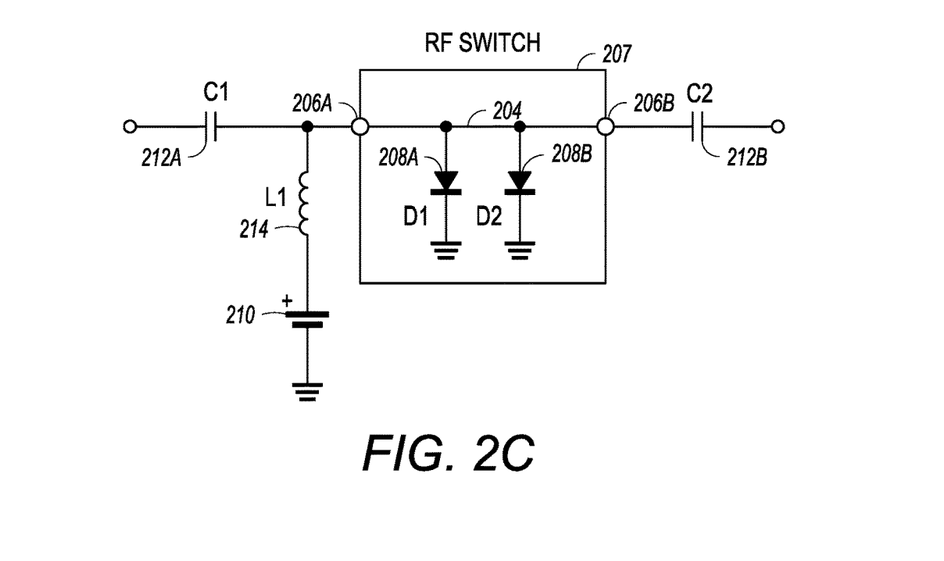
FIG. 2C is a diagram depicting an embodiment of a particular implementation of the RF switch.

FIG. 2C is a diagram depicting an embodiment of a particular implementation of the RF switch 102. In this embodiment, the switching element 207 comprises two diodes D1 208A and D2 208B (i.e. embedded PIN diodes), which are in parallel and electrically connected between a conductive path 204 between nodes 206A and 206B and an electrical ground. This particular architecture of an RF switch 102 is considered a reflective single-pole single-throw (SPST) shunt switch in a normally closed position (i.e., electrically shorted). The application of an appropriate voltage from voltage source 210 turns diodes D1 208A and D2 208B on, thus effectively isolating node 206A from node 206B placing the switch in an open position (i.e., electrically open). Since the RF switch 102 may be inserted between other components that have their own impedance characteristics such as a low noise amplifier (LNA), filter, mixer, etc., capacitors C1 212A and C2 212B may be included so that such impedances from such components do not electrically load down the switch. Further, inductor L1 214 removes unwanted high frequency noise from voltage source 210 but is not necessary if a voltage source with suppressed noise is utilized.

In one embodiment, the RF switch 102 is embodied in a high frequency RF switch such as the model MA4AGSW1 available from the MACOM TECHNOLOGY SOLUTIONS. The MA4AGSW1 is a AlGaAs pin diode SPST RF switch designed to operate past 50 GHz with insertion losses of <0.15 dB at 10 GHz. The MA4AGSW1 is available in die form with die dimensions of 0.75 mm×0.62 mm×0.10 mm.

Figure 3A:
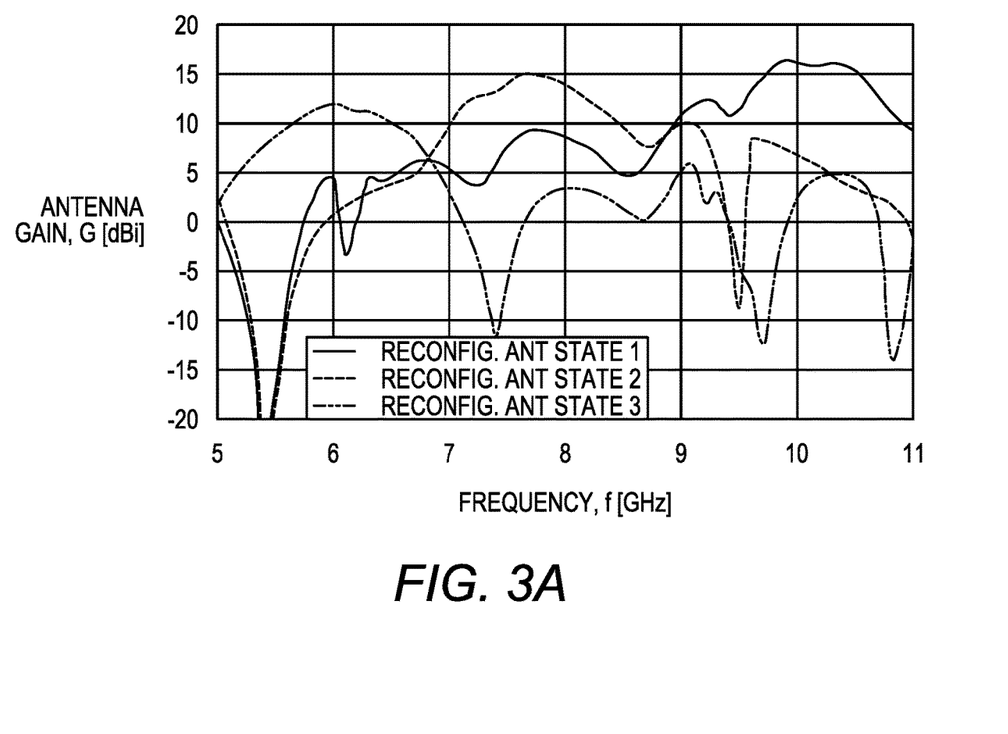
FIGS. 3A and 3B are plots depicting the predicted performance of a 4×4 reconfigurable aperture coupled patch antenna designed to nominally operate near 10 GHz.
Figure 3B:
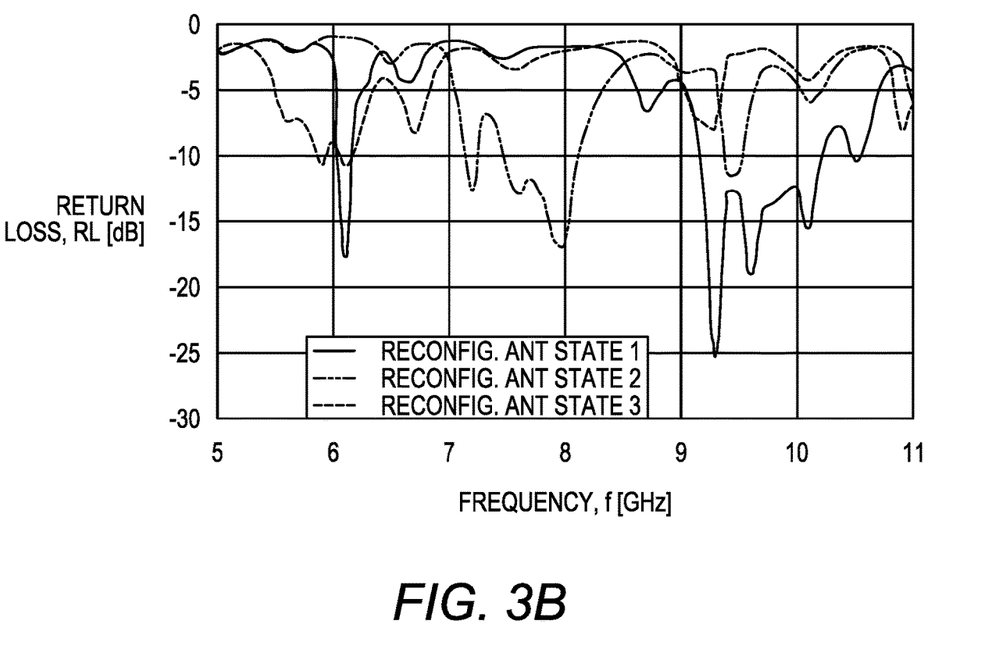

FIGS. 3A and 3B are plots depicting the predicted performance of a 4×4 reconfigurable aperture coupled patch antenna designed to nominally operate near 10 GHz. The surface dimensions of the 4×4 array are 95 mm×70 mm and the board have four 10 Mil PYRALUX layers.

The results (generated with a finite element model (FEM) solver) demonstrate that the resonant frequency of the antenna shifts down from 10 GHz to 7.7 GHz and further down to 6 GHz when the RF switches 102A and 102B are activated to electrically short the first coupling antenna element component 106C and the second coupling element component 106D to the inner antenna element component 106A. The antenna performance, specifically the antenna gain shown in FIG. 3A, naturally decreases as the resonant frequency decreases. The gain of a planar antenna for a given thickness decreases with decreasing resonant frequency due to the necessary wavelength required to maintain the antenna gain.

Figure 4:
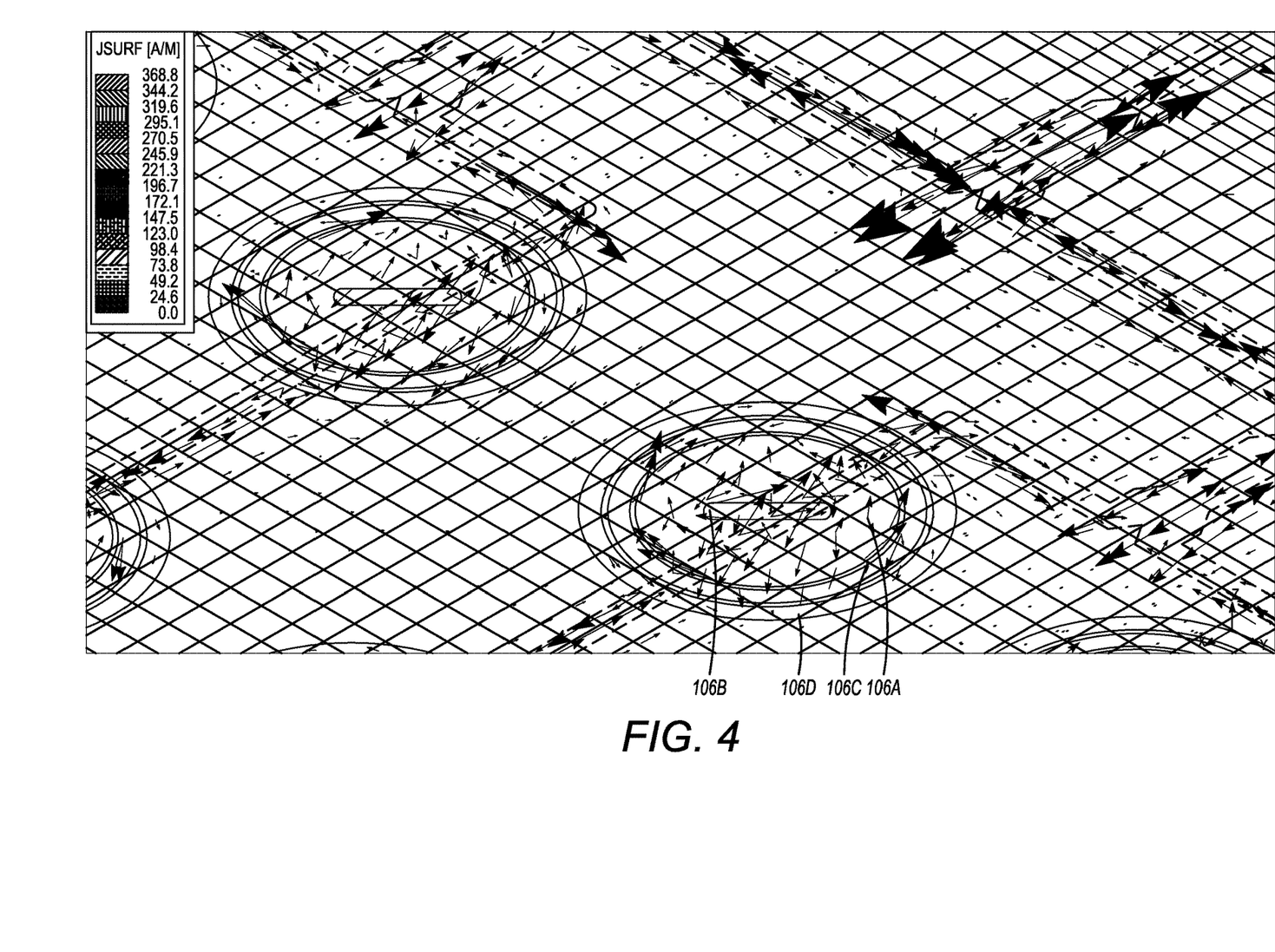
FIG. 4 is a diagram of a field plot showing the current density in vector form for the reconfigurable aperture coupled patch antenna operating at 10 GHz.

FIG. 4 is a diagram of a field plot showing the current density (in A/m) in vector form for the reconfigurable aperture coupled patch antenna 100 operating at 10 GHz. The current is seen to be electrically coupling (or traveling) from the microstrip line 116 to the patch antenna element 106 with inclusive slot 106B. The circular rotation of the current along the surface of the patch antenna element 106 is indicative that the slot 106B is forcing the current to travel around the antenna (i.e., rotate) rather than go in a linear direction, which results in circular polarization.

Figure 5A:
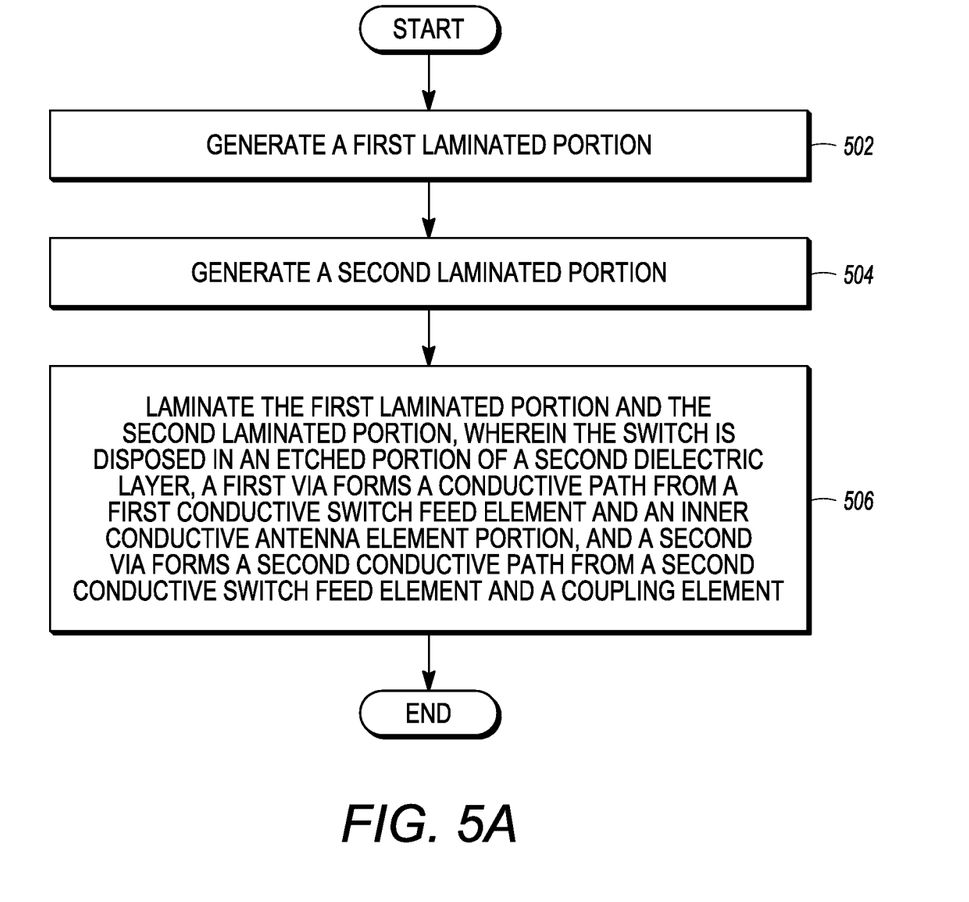
FIGS. 5A-5C are diagrams illustrating exemplary operations that can be used to produce the reconfigurable aperture coupled patch antenna.
Figure 5B:
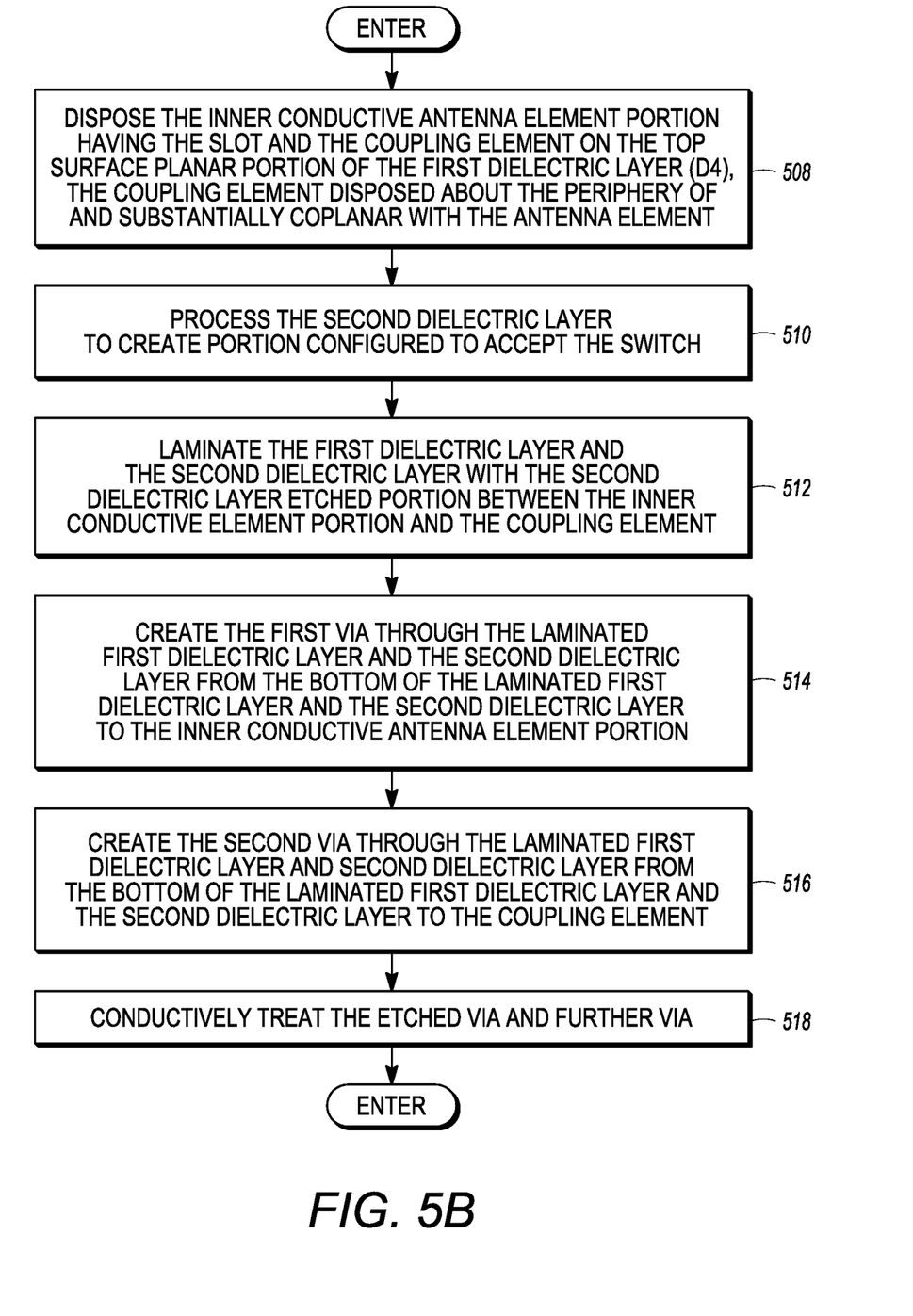
Figure 5C:
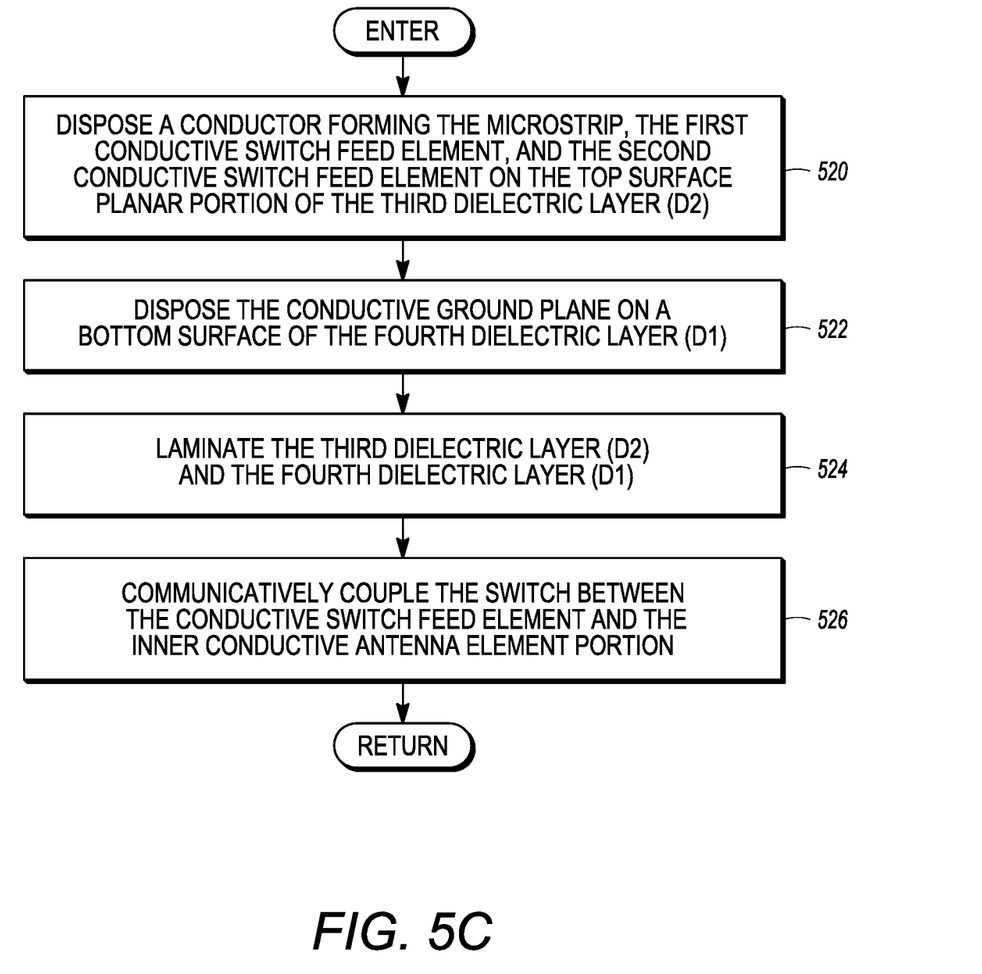
Figure 6:
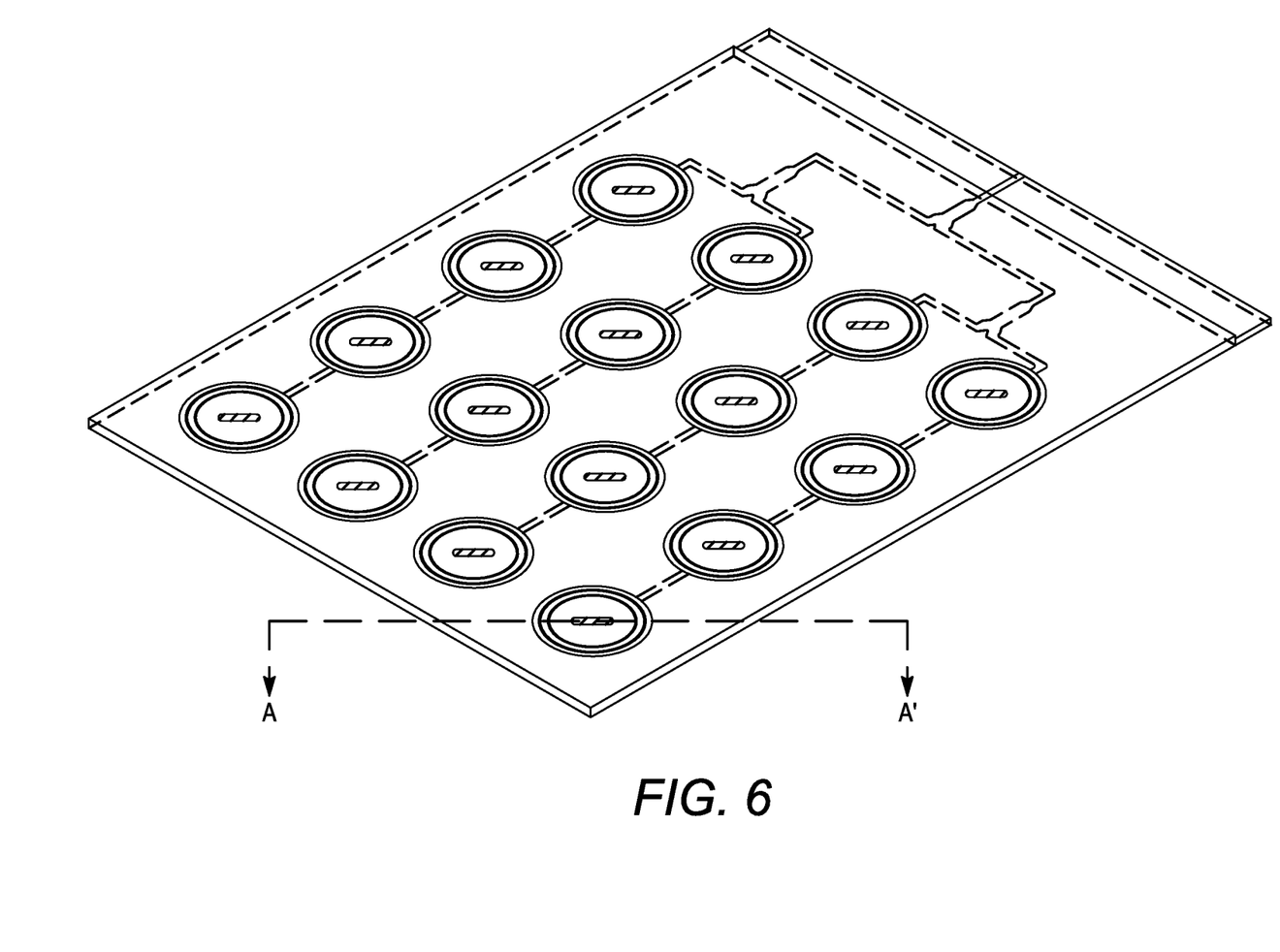
FIG. 6 is a diagram of the reconfigurable aperture coupled patch antenna showing a slice depicted in FIGS. 7A-7I.

FIGS. 5A-5C are diagrams illustrating exemplary operations that can be used to produce the reconfigurable aperture coupled patch antenna 100. FIGS. 5A-5C will be discussed in conjunction with FIGS. 7A-7I, which depict the reconfigurable aperture coupled patch antenna 100 at the different stages of the production at the cut A-A' illustrated in FIG. 6.

FIG. 5A is a diagram illustrating exemplary operations for generating a first and second laminated portion and laminating the first and second laminated portions together to produce the antenna 100. In block 502, a first laminated portion is generated. The first laminated portion (illustrated in realized form in FIG. 7D) comprises a conductive inner antenna element component 106A having a slot 106B (not shown) and a coupling antenna element component 106C on a top surface planar portion of a first dielectric layer 702. The first laminated portion also comprises a second dielectric layer 704 having a portion 706B configured to accept a switch 102A, a conductive via 710C through the laminated first dielectric layer 702 and second dielectric layer 704 from a bottom of the laminated first dielectric layer 702 and the second dielectric layer 704 to the inner antenna element component 106A, and a second conductive via 710B through the laminated first dielectric layer 702 and second dielectric layer 704 from the bottom of the laminated first dielectric layer 702 and the second dielectric layer 704 to the coupling antenna element component 106C.

In block 504, a second laminated portion is generated. The second laminated portion (illustrated in realized form in FIG. 7H) comprises a microstrip formed by conductive ground plane 720 and conductor 116, a first conductive switch feed element 712C, and a second conductive switch feed element 712B on a top surface of a third dielectric layer

Figure 7A:
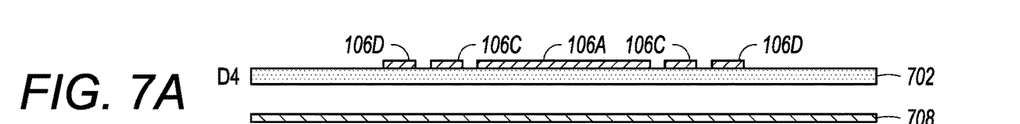
FIGS. 7A-7I, which depict the reconfigurable aperture coupled patch antenna at the different stages of the production at the slice A-A' illustrated in FIG. 6.
Figure 7B:
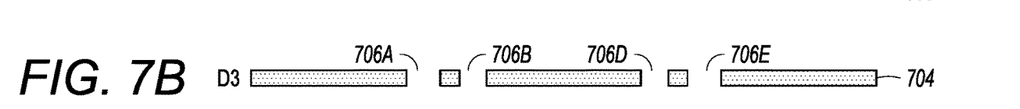
Figure 7C:
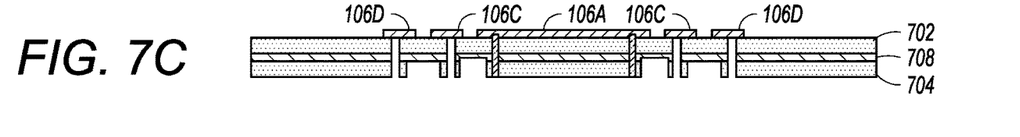

714, a conductive ground plane 720 on a bottom surface of a fourth dielectric layer 718, and a switch 102A, electrically connected between the second conductive switch feed element 712B and the conductive antenna element 712C.

In block 506, the first laminated portion and the second laminated portion are laminated such that the switch 102A is disposed in the portion 706B of the second dielectric layer 704, the first via 710C forms a conductive path from the first conductive switch feed element 712C and the conductive antenna element 106A, and the second via 710B forms a second conductive path from the second conductive switch feed element 712B and the coupling antenna element component 106C.

Figure 7D:
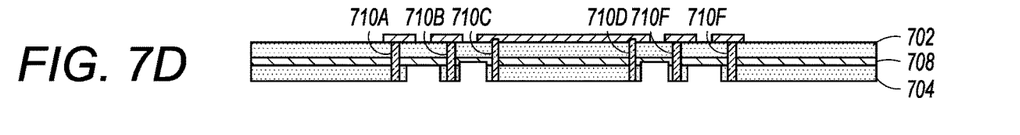
Figure 7E:
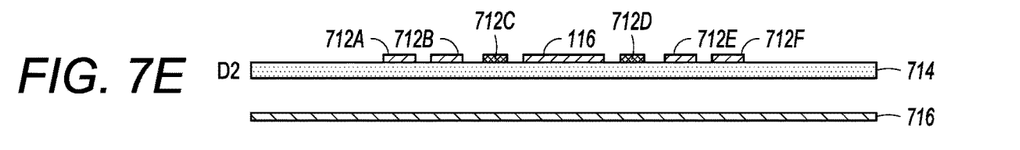
Figure 7F:
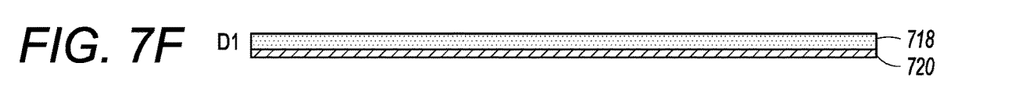
Figure 7G:
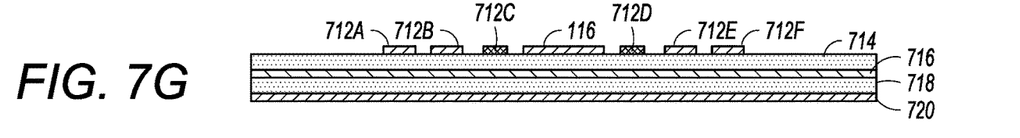
Figure 7H:
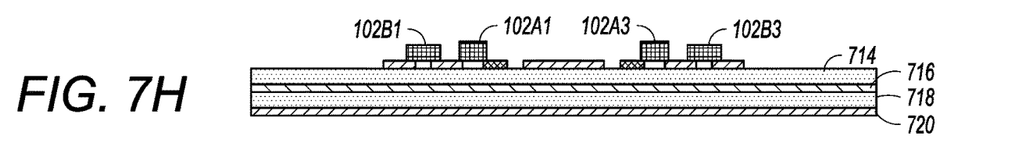
Figure 7I:
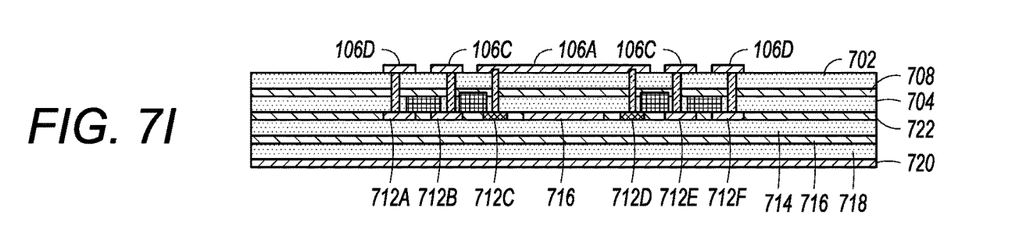

FIG. 5B is a diagram illustrating exemplary operations used to generate the first laminated portion illustrated in FIG. 7D. In block 508, the conductive inner antenna element component 106A having a slot 106B (not shown) and the coupling antenna element component 106C are disposed on the top surface planar portion of the first dielectric layer 702. The result is illustrated in FIG. 7A.

In block 510, the second dielectric layer 704 is processed to create a portion 706B configured to accept switch 102A. The result is illustrated in FIG. 7B. This can be accomplished, for example, by etching. In block 512, the first dielectric layer 702 and the second dielectric layer 704 are laminated. After lamination, the portion 706B is disposed in a location between the conductive inner antenna element component 106A and the coupling antenna element component 106C so as to accept switch 102A.

In block 514, a first via 710C is created through the first dielectric layer 702 and the second dielectric layer 704 (now laminated) from the bottom of the second dielectric layer 704 to the inner antenna element component 106A. In block 516, a second via 710B is created through the first dielectric layer 702 and second dielectric layer 704 from the bottom of the second dielectric layer 704 to the coupling antenna element component 106C. Finally, in block 518, the first via 710C and the second via 710B are conductively treated. The result is the first laminated portion shown in FIG. 7D.

FIG. 5C is a diagram illustrating exemplary operations used to generate the second laminated portion as shown in FIG. 7H. In block 520, a conductor 116 forming the microstrip, the first conductive switch feed element 712C, and the second conductive switch feed element 712B are disposed on the top surface planar portion of the third dielectric layer 714. In block 522, the conductive ground plane 720 is disposed on a bottom surface of the fourth dielectric layer 718. In block 524, the third dielectric layer 714 and the fourth dielectric layer 718 are laminated. In block 526, the switch 102A is electrically connected between the second conductive switch feed element 712B and the conductive antenna element 712C.

The fabrication process can be accomplished using a combination of subtractive (e.g. laser etch, milling, wet etching) and additive (e.g. printing, film deposition) techniques. Different dielectric layers 702, 704, 714, and 718 of the antenna are then aligned and laminated, for example, using adhesive films 708, 716 and 722. The placement of conductive surfaces on dielectric layer surfaces can be accomplished for example, by patterning the conductive material (e.g., copper) or by printing conductive ink to deposit the conductive material in the desired locations.

Portions of the adhesive films 708, 716 and 722 that must be removed to achieve the structure shown in FIGS. 7A-7I may be removed before lamination, or processed after lamination (e.g., using an etching technique). Further, layers 702, 704, 714 and 718 may be created in any order, but unless otherwise noted, should be layered as illustrated before lamination. Nominally, dielectric layers 702, 704, 714 and 718 are composed of a dielectric material having a relative permittivity (ratio of absolute permittivity to the permittivity of a vacuum) of approximately ten.

The foregoing describes the use of only one coupling antenna element component 106C and a single switch 102A to electrically short (upon activation) the conductive inner antenna element component 106A to the coupling antenna element component 106C. As shown in FIGS. 1A and 1B, the antenna 100 may be implemented with a second coupling element component 106D (or more coupling elements), which are fabricated as shown in FIGS. 7A-7I. Further, multiple switching elements (102A1-102A4) can be used to electrically short (upon activation) the conductive inner antenna element component 106A to the coupling antenna element component 106C and multiple switching elements (102B1-102B4) may be used to electrically short (upon activation) coupling antenna element component 106C to further coupling element component 106D. In these embodiments, the first laminated portion also includes a second coupling element component 106D, and the second dielectric layer has additional portions 706A, 706D and 706E for accepting additional switches. Further, the first laminated portion also includes vias 710A and 710F, with via 710 electrically shorting (upon activation) additional conductive switch feed elements 712A and 712F to the second coupling element component 106D via additional switches 102B1 and 102B3. The foregoing structure for supporting two coupling element components 106C and 106D can be extended to as many coupling elements are desired.

Signal Transception

The foregoing antenna 100 can be used to transmit and/or receive (transceive) signals. In transmission, signals provided to the feed created by conductor 116 are transformed into a transmitted RF signal by antenna elements 106 and associated structures. In reception, RF signals are provided to the antenna elements 106 and associated structures and transformed into a received signal at the conductor 116.

For example, referring again to FIG. 1A, when used for transmission, the antenna 100 receives a signal at power input, and this signal is provided by the conductor 116 to the aperture coupled antenna elements 106 for transmission as an RF signal. The aperture coupled antenna elements 106 are electrically altered to change an operating frequency (or frequency range) of the antenna 100 as required for the desired RF signal frequency. This is accomplished by selectably activating at least a portion of the switches 102 to electrically couple one or more of the coupling antenna element components (106B and 106C) to the inner antenna element components 106A.

Hardware Environment

Figure 8:
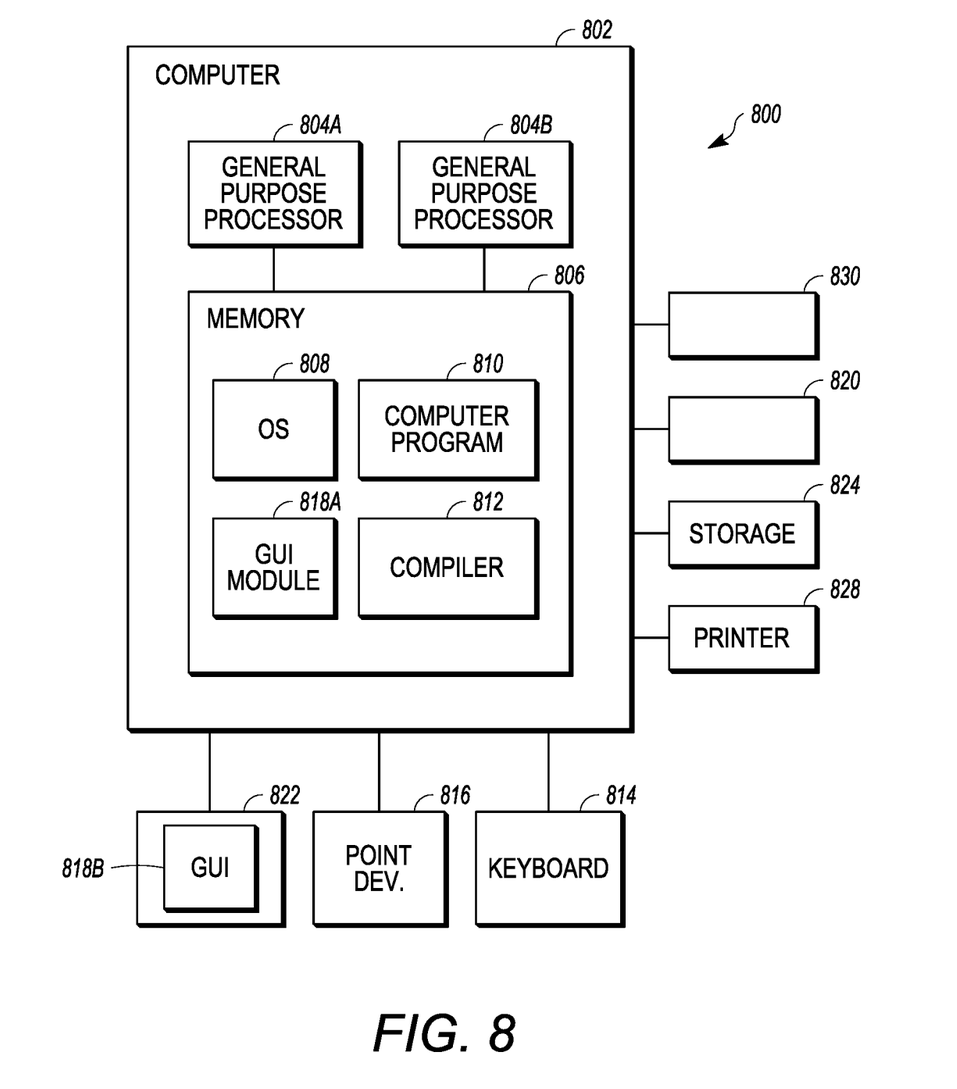
FIG. 8 is a diagram illustrating an exemplary computer system that could be used to implement processing elements of the above disclosure.

FIG. 8 is a diagram illustrating an exemplary computer system 800 that could be used to implement processing elements of the above disclosure, including the defining of the conductive structures and etching of the dielectric layers. The computer 802 comprises a processor 804 which may include a general purpose processor 804A and/or a special purpose processor 804B and a memory, such as random access memory (RAM) 806. The computer 802 is operatively coupled to a display 822, which presents images such as windows to the user on a graphical user interface (GUI)

818B. The computer 802 may be coupled to other devices, such as a keyboard 814, a mouse device 816, a printer, etc. Of course, those skilled in the art will recognize that any combination of the above components, or any number of different components, peripherals, and other devices, may be used with the computer 802, including printer 828.

Generally, the computer 802 operates under control of an operating system 808 stored in the memory 806, and interfaces with the user to accept inputs and commands and to present results through a GUI module 818A. Although the GUI module 818B is depicted as a separate module, the instructions performing the GUI functions can be resident or distributed in the operating system 808, the computer program 810, or implemented with special purpose memory and processors. The computer 802 also implements a compiler 812 which allows an application program 810 written in a programming language such as COBOL, C++, FORTRAN, or other language to be translated into processor 804 readable code. After completion, the application 810 accesses and manipulates data stored in the memory 806 of the computer 802 using the relationships and logic that was generated using the compiler 812. The computer 802 also optionally comprises an external communication device such as a modem, satellite link, Ethernet card, or other device for communicating with other computers.

In one embodiment, instructions implementing the operating system 808, the computer program 810, and the compiler 812 are tangibly embodied in a computer-readable medium, e.g., data storage device 820, which could include one or more fixed or removable data storage devices, such as a zip drive, floppy disc drive 824, hard drive, CD-ROM drive, tape drive, etc. Further, the operating system 808 and the computer program 810 are comprised of instructions which, when read and executed by the computer 802, causes the computer 802 to perform the operations herein described. Computer program 810 and/or operating instructions may also be tangibly embodied in memory 806 and/or data communications devices 830, thereby making a computer program product or article of manufacture. As such, the terms "article of manufacture," "program storage device" and "computer program product" as used herein are intended to encompass a computer program accessible from any computer readable device or media.

Those skilled in the art will recognize many modifications may be made to this configuration without departing from the scope of the present disclosure. For example, those skilled in the art will recognize that any combination of the above components, or any number of different components, peripherals, and other devices, may be used.

CONCLUSION

This concludes the description of the preferred embodiments of the present disclosure.

The foregoing description of the preferred embodiment has been presented for the purposes of illustration and description. It is not intended to be exhaustive or to limit the disclosure to the precise form disclosed. Many modifications and variations are possible in light of the above teaching. It is intended that the scope of rights be limited not by this detailed description, but rather by the claims appended hereto.

What is claimed is:

1. An electronically configurable antenna, comprising: circuit board, comprising:
    a composite dielectric, having:
        a top surface, having an antenna element including:
            an inner antenna element component disposed on the top surface; and
            a coupling antenna element component disposed about a periphery of and substantially coplanar with the inner antenna element component, the coupling antenna element component electrically coupled to the inner antenna element component; and
        a bottom surface, having:
            a conductive ground plane; and
            a conductor, extending through the composite dielectric between the top surface and the bottom surface, the conductor forming an aperture-coupled microstrip feed extending from an antenna input to the antenna element.

2. The electronically configurable antenna of claim 1, wherein:
    the coupling antenna element component is coplanar with the inner antenna element component.

3. The electronically configurable antenna of claim 2, wherein:
    the inner antenna element component is circular; and
    the coupling antenna element component is an annulus concentric with the inner antenna element component having an interior radius larger than an exterior radius of the inner antenna element component by a distance d.

4. The electronically configurable antenna of claim 3, wherein:
    the coupling antenna element component is selectably electrically shorted to the inner antenna element component by at least one RF switch.

5. The electronically configurable antenna of claim 4, wherein the RF switch comprises an embedded pin diode single-pole single-throw (SPST) switch.

6. The electronically configurable antenna of claim 5, wherein:
    the top surface comprises a second coupling antenna element component disposed about a periphery of the coupling antenna element component, the second coupling antenna element component electrically coupled to the coupling antenna element component.

7. The electronically configurable antenna of claim 6, wherein:
    the second coupling antenna element component is selectably electrically shorted to the coupling antenna element component by at least one second RF switch.

8. The electronically configurable antenna of claim 1, wherein:
    the inner antenna element component comprises an inner antenna conductive surface having an aperture; and
    the inner antenna conductive surface is aperture coupled to the microstrip feed.

9. The electronically configurable antenna of claim 1, wherein:
    the inner antenna element component comprises an inner antenna conductive surface that comprises a slot; and
    at least a portion of the microstrip feed is disposed within the composite dielectric between the slot and the bottom surface conductive ground plane.

10. The electronically configurable antenna of claim 1, wherein:
    the top surface comprises an array of a plurality of antenna elements, each comprising an associated slot; and
    at least a portion of the microstrip feed is disposed within the composite dielectric between each of the array of the plurality of antenna elements and the bottom surface conductive ground plane.

11. The electronically configurable antenna of claim 10, wherein the conductor further forms one or more power dividers disposed between the at least a portion of the microstrip feed disposed under each of the array of the plurality of antenna elements.

12. The electronically configurable antenna of claim 1, wherein:
the antenna element is formed by a first conductive material on a top surface of a first layer of the composite dielectric;
the conductor is formed by a second conductive material on a top surface of a third layer of the composite dielectric; and
the bottom surface conductive ground plane is formed by a third conductive material on a bottom surface of a fourth layer of the composite dielectric.

13. The electronically configurable antenna of claim 12, wherein
the first conductive material is patterned on the top surface of the first layer of the composite dielectric;
the second conductive material is patterned on the top surface of the third layer of the composite dielectric; and
the third conductive material is patterned on the bottom surface of the fourth layer of the composite dielectric.

14. The electronically configurable antenna of claim 12, wherein
the first conductive material is printed on the top surface of the first layer of the composite dielectric;
the second conductive material is printed on the top surface of the third layer of the composite dielectric; and
the third conductive material is printed on the bottom surface of the fourth layer of the composite dielectric.

15. A method of forming a planar array antenna, comprising:
generating a first laminated portion, the first laminated portion comprising:
an inner antenna element component having a slot and a coupling antenna element component on a top surface planar portion of a first dielectric layer, the coupling antenna element component disposed about a periphery of and substantially coplanar with the inner antenna element component;
a second dielectric layer having a portion configured to accept a switch;
a first conductive via through the first dielectric layer and the second dielectric layer from a bottom of the first dielectric layer and the second dielectric layer to the inner antenna element component; and
a second conductive via through the first dielectric layer and second dielectric layer from the bottom of the first dielectric layer and the second dielectric layer to the coupling antenna element component;
generating a second laminated portion, the second laminated portion comprising:
a microstrip, a first conductive switch feed element, and a second conductive switch feed element on a top surface of a third dielectric layer;
a conductive ground plane on a bottom surface of a fourth dielectric layer; and
a switch, electrically connected between the first conductive switch feed element and the inner antenna element component; and laminating the first laminated portion and the second laminated portion, wherein:
the switch is disposed in the portion of the second dielectric layer;
the first conductive via forms a conductive path from the first conductive switch feed element and the inner antenna element component; and
the second conductive via forms a second conductive path from the second conductive switch feed element and the coupling antenna element component.

16. The method of claim 15, wherein:
generating a first laminated portion comprises:
disposing the inner antenna element component having the slot and the coupling antenna element component on the top surface planar portion of the first dielectric layer, the coupling antenna element component disposed about a periphery of the inner antenna element component;
processing the second dielectric layer to create a portion configured to accept the switch;
laminating the first dielectric layer and the second dielectric layer with the second dielectric layer between the inner antenna element component and the coupling antenna element component;
etching a first via through the laminated first dielectric layer and the second dielectric layer from the bottom of the laminated first dielectric layer and the second dielectric layer to the inner antenna element component;
etching a second via through the laminated first dielectric layer and second dielectric layer from the bottom of the laminated first dielectric layer and the second dielectric layer to the coupling antenna element component; and
conductively treating the first via and the second via; and
generating the second laminated portion comprises:
disposing the microstrip, the first conductive switch feed element, and the second conductive switch feed element on the top surface planar portion of the third dielectric layer;
disposing the conductive ground plane on a bottom surface of the fourth dielectric layer;
laminating the third dielectric layer and the fourth dielectric layer; and
electrically connecting the switch between the first conductive switch feed element and the inner antenna element component.

17. The method of claim 15, wherein the inner antenna element component is formed by patterning or printing the antenna element on the first dielectric layer.

18. The method of claim 15, wherein the coupling antenna element component is disposed about a periphery of the inner antenna element component.

19. A planar array antenna, formed by a method comprising:
generating a first laminated portion, the first laminated portion comprising:
an inner antenna element component having a slot and a coupling antenna element component on a top surface planar portion of a first dielectric layer, the coupling antenna element component disposed about a periphery of and substantially coplanar with the inner antenna element component;
a second dielectric layer having a portion configured to accept a switch;

a first conductive via through the first dielectric layer and the second dielectric layer from a bottom of the first dielectric layer and the second dielectric layer to the inner antenna element component; and a second conductive via through the first dielectric layer and second dielectric layer from the bottom of the first dielectric layer and the second dielectric layer to the coupling antenna element component;

generating a second laminated portion, the second laminated portion comprising:

a microstrip, a first conductive switch feed element, and a second conductive switch feed element on a top surface of a third dielectric layer;

a conductive ground plane on a bottom surface of a fourth dielectric layer; and a switch, electrically connected between the first conductive switch feed element and the inner antenna element component; and laminating the first laminated portion and the second laminated portion, wherein:

the switch is disposed in the portion of the second dielectric layer;

the first conductive via forms a conductive path from the first conductive switch feed element and the inner antenna element component; and the second conductive via forms a second conductive path from the second conductive switch feed element and the coupling antenna element component.

20. The planar array antenna of claim 19, wherein:

generating a first laminated portion comprises:

disposing the inner antenna element component having the slot and the coupling antenna element component on the top surface planar portion of the first dielectric layer, the coupling antenna element component disposed about the periphery of and substantially coplanar with the inner antenna element component;

processing the second dielectric layer to create portion configured to accept the switch;

laminating the first dielectric layer and the second dielectric layer with the second dielectric layer portion between the inner antenna element component and the coupling antenna element component;

etching a first via through the laminated first dielectric layer and the second dielectric layer from the bottom of the laminated first dielectric layer and the second dielectric layer to the inner antenna element component;

etching a second via through the laminated first dielectric layer and second dielectric layer from the bottom of the laminated first dielectric layer and the second dielectric layer to the coupling antenna element component; and conductively treating the first via and second via; and generating the second laminated portion comprises:

disposing the microstrip, the first conductive switch feed element, and the second conductive switch feed element on the top surface planar portion of the third dielectric layer;

disposing the conductive ground plane on a bottom surface of the fourth dielectric layer;

laminating the third dielectric layer and the fourth dielectric layer; and electrically connecting the switch between the first conductive switch feed element and the inner antenna element component.

* * * * *